US009368530B2

(12) United States Patent
Tsau et al.

(10) Patent No.: US 9,368,530 B2
(45) Date of Patent: Jun. 14, 2016

(54) IMAGE SENSOR AND COLOR FILTER ARRAY INCLUDING MULTIPLE SELECTABLE MESHED FILTER SETS

(71) Applicant: OmniVision Technologies, Inc., Santa Clara, CA (US)

(72) Inventors: Guannho George Tsau, San Jose, CA (US); Edward Nabighian, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 266 days.

(21) Appl. No.: 13/773,143

(22) Filed: Feb. 21, 2013

(65) Prior Publication Data

US 2014/0231621 A1    Aug. 21, 2014

(51) Int. Cl.
*H01L 27/00*    (2006.01)
*H01L 27/146*    (2006.01)
*G02B 5/20*    (2006.01)

(52) U.S. Cl.
CPC .......... *H01L 27/14621* (2013.01); *G02B 5/201* (2013.01)

(58) Field of Classification Search
CPC ... H01L 27/14621; H04N 9/045; G02B 5/201
See application file for complete search history.

(56) References Cited

U.S. PATENT DOCUMENTS

| 7,623,172 | B2 | 11/2009 | Wada et al. | |
| 7,671,316 | B2 * | 3/2010 | Kanai et al. | 250/208.1 |
| 8,759,742 | B2 * | 6/2014 | Yokogawa | 250/225 |
| 8,958,000 | B2 * | 2/2015 | Tanaka et al. | 348/273 |
| 2008/0151083 | A1 | 6/2008 | Hains et al. | |
| 2010/0320369 | A1 * | 12/2010 | Koskinen | H04N 5/3355 250/226 |

FOREIGN PATENT DOCUMENTS

| TW | 2008-04886 A | 1/2008 |
| TW | 2012-43502 A | 11/2012 |
| WO | WO 2010/138152 A1 | 12/2010 |
| WO | WO 2010/141055 A2 | 12/2010 |

OTHER PUBLICATIONS

CN 2013-10574247.X—First Chinese Office Action with English translation, issued Jun. 5, 2015, 9 pages.
TW 102138548—First Taiwan Office Action, issued Jul. 30, 2015, 10 pages.
CN 2013-10574247.X—Second Chinese Office Action with English translation, issued Feb. 1, 2016, 11 pages.

* cited by examiner

*Primary Examiner* — Tony Ko
(74) *Attorney, Agent, or Firm* — Blakely Sokoloff Taylor & Zafman LLP (57) ABSTRACT

An apparatus including a pixel array including a plurality of pixels and a filter array positioned over the pixel array, the color filter array comprising a plurality of tiled minimal repeating units, each minimal repeating unit including a plurality of enmeshed filter sets, each filter set including a different set of colors than any other filter set in the filter array. Other embodiments are disclosed and claimed.

27 Claims, 9 Drawing Sheets

*Fig. 6E*

IMAGE SENSOR AND COLOR FILTER ARRAY INCLUDING MULTIPLE SELECTABLE MESHED FILTER SETS

TECHNICAL FIELD

The described embodiments relate generally to image sensors, and in particular, but not exclusively, to an image sensor and color filter array including multiple and selectable meshed filter sets.

BACKGROUND

Image sensors are widely used in digital still cameras, cellular phones, security cameras, medical, automobile, and other applications. Complementary metal-oxide-semiconductor ("CMOS") technology is used to manufacture low-cost image sensors on silicon substrates.

Most image sensors include a two-dimensional array of pixels that are used to capture images. Color image sensors—that is, image sensors capable of capturing color images—assign color to each pixel in the pixel array using a color filter array ("CFA") coupled to the pixel array. In current image sensors, different types of CFA patterns must be designed for image sensors to meet different needs; this requires multiple silicon chip mask sets or the pixel array, as well as in multiple mask sets for the color filter array.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments are described of an apparatus, system and method for an image sensor with a color filter array including multiple and selectable meshed filter sets. Specific details are described to provide a thorough understanding of the embodiments, but one skilled in the relevant art will recognize that the invention can be practiced without one or more of the described details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one described embodiment. Thus, appearances of the phrases "in one embodiment" or "in an embodiment" do not necessarily all refer to the same embodiment. Furthermore, the described features, structures, or characteristics may be combined in any suitable manner in one or more embodiments.

Figure 1:
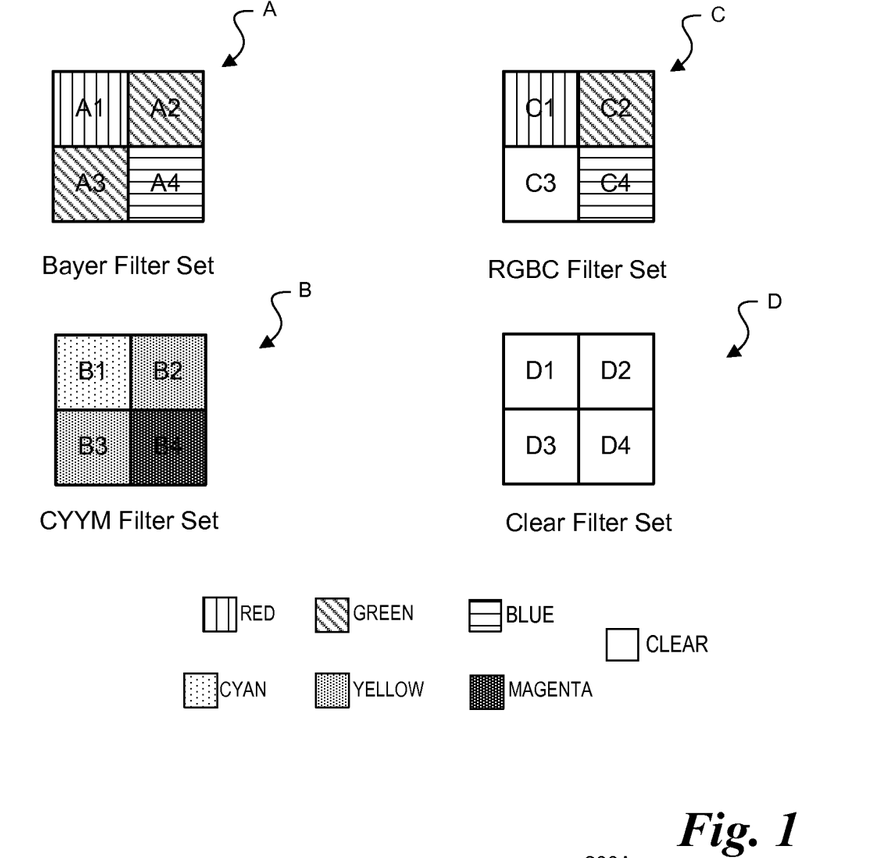
FIG. 1 is a plan view of four embodiments of a filter set.

FIG. 1 illustrates embodiments of filter sets A-D that can be used to form a minimal repeating unit for a color filter array. Filter set A includes four individual filters A1-A4. The individual filters include three primary colors: red (R), green (G), and blue (B). Primary colors are a set of colors identified as the building blocks for all other colors. Examples of primary colors include red, green and blue (commonly referred to as RGB) and cyan, magenta and yellow (commonly referred to as CMY). In the RGB color model, for example, combining varying amounts of red, green and blue will create all the other colors in the spectrum. In the illustrated embodiments filter A1 is red, filters A2-A3 are green, and filter A4 is blue, thus itself forming a minimal repeating unit of the well-known Bayer pattern. The Bayer pattern has twice as many green pixels as red or blue pixels, and they are arranged in alternating rows of red wedged between greens, and of blue wedged between greens. This pattern takes advantage of the human eye's predilection to see green luminance as the strongest influence in defining sharpness. Of course, in other embodiments of filter set A the number of filters of each color, as well as the arrangement of colors, can be different than shown.

Filter set B also includes four individual filters B1-B4, but instead of the RGB primary color set it includes an alternate primary color set of cyan (C), yellow (Y), and magenta (M). In the illustrated embodiment, individual filter B1 is cyan, individual filters B2-B3 are yellow, and individual filter B4 is magenta, thus forming what is sometimes known is a CYYM filter arrangement. Of course, in other embodiments of filter set B the number of filters of each color, as well as the arrangement of colors, can be different than shown.

Filter set C also includes four individual filters C1-C4 that include three filters that form the RGB primary color set plus one clear filter. In filter set C, individual filter C1 is red, individual filter C2 is green, individual filter C3 is clear, and individual filter C4 is blue. For purposes of this disclosure, a clear filter is one that is colorless and/or optically transparent in a range of wavelengths that includes at least the range of wavelengths encompassed by a primary color set. Of course, in other embodiments of filter set C the number of filters of each color, as well as the arrangement of colors, can be different than shown.

Filter set D also includes four individual filters D1-D4, all of which are clear. As above, a clear filter is one that is colorless and/or optically transparent over at least the range of wavelengths encompassed by a primary color set.

In illustrated filter sets A-D every filter set includes four individual filters, but in other embodiments each filter set can have a lesser or greater number of individual filters, and every filter set need not include the same number of individual filters as other filter sets. Moreover, other embodiments can use filter sets with different and/or additional primary color sets than shown. In still other embodiments, at least one filter set can include one or more individual filters that can filter wavelengths outside the visible wavelength range, such as infrared and ultraviolet.

Figure 2:
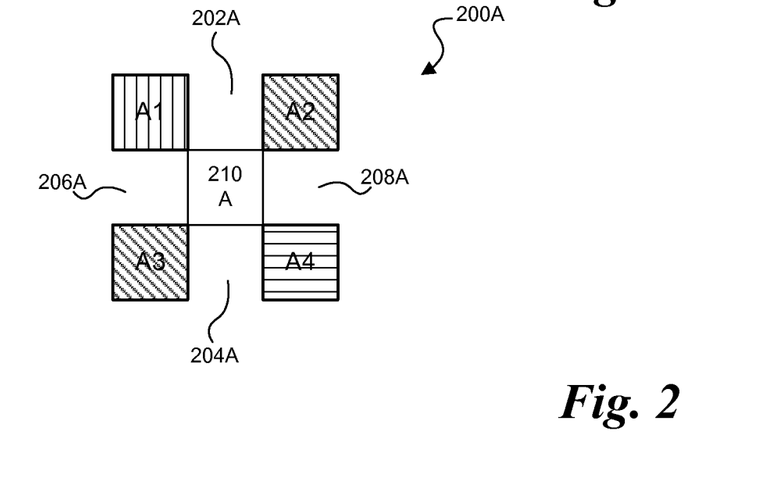
FIG. 2 is a plan view of another embodiment of a filter set that includes interstitial spaces between individual filters.

FIG. 2 illustrates an alternative embodiment of a filter set 200 that includes interstitial spaces between individual filters.

The illustrated embodiment is a filter set 200A that is a variation of filter set A shown in FIG. 1. In filter set A the individual filters abut each other, but this is not strictly necessary. For example, filter set 200A is a variation of filter set A in which interstitial spaces have been added between individual filters in the set: interstitial space 202A is inserted between individual filters A1 and A2, interstitial space 204A is inserted between individual filters A3 and A4, interstitial space 206A is inserted between individual filters A1 and A3, and interstitial space 208A is inserted between individual filters A2 and A4. As a result of adding interstitial spaces 202A-208A, a central interstitial space 210A is created in the center of the filter set. The interstitial spaces between individual filters do not alter the character of the filter set. Filter set A is an RGB filter set with a Bayer pattern, and so is filter set 200A, even with the interstitial spaces between individual filters.

Similar filter sets with interstitial spaces can be formed for filter sets B, C, and D of FIG. 1. Thus, filter set B has a corresponding filter set 200B that includes interstitial spaces between individual filters (see FIG. 3A), and filter sets C and D similarly have corresponding filter sets 200C and 200D that include interstitial spaces (see FIG. 3B).

FIGS. 3A-3D illustrate an embodiment of a sequence for assembling four filter sets 200A-200D into a minimal repeating unit (MRU) of a color filter array. A minimal repeating unit is a repeating unit such that no other repeating unit has fewer individual filters. A given color filter array can include several repeating units, but a repeating unit is not a minimal repeating unit if there is another repeating unit in the array that includes fewer individual filters. The sequence shown in FIGS. 3A-3D is merely an example; the MRU can of course be put together in a different sequence, or can be formed all at once.

Figure 3A:
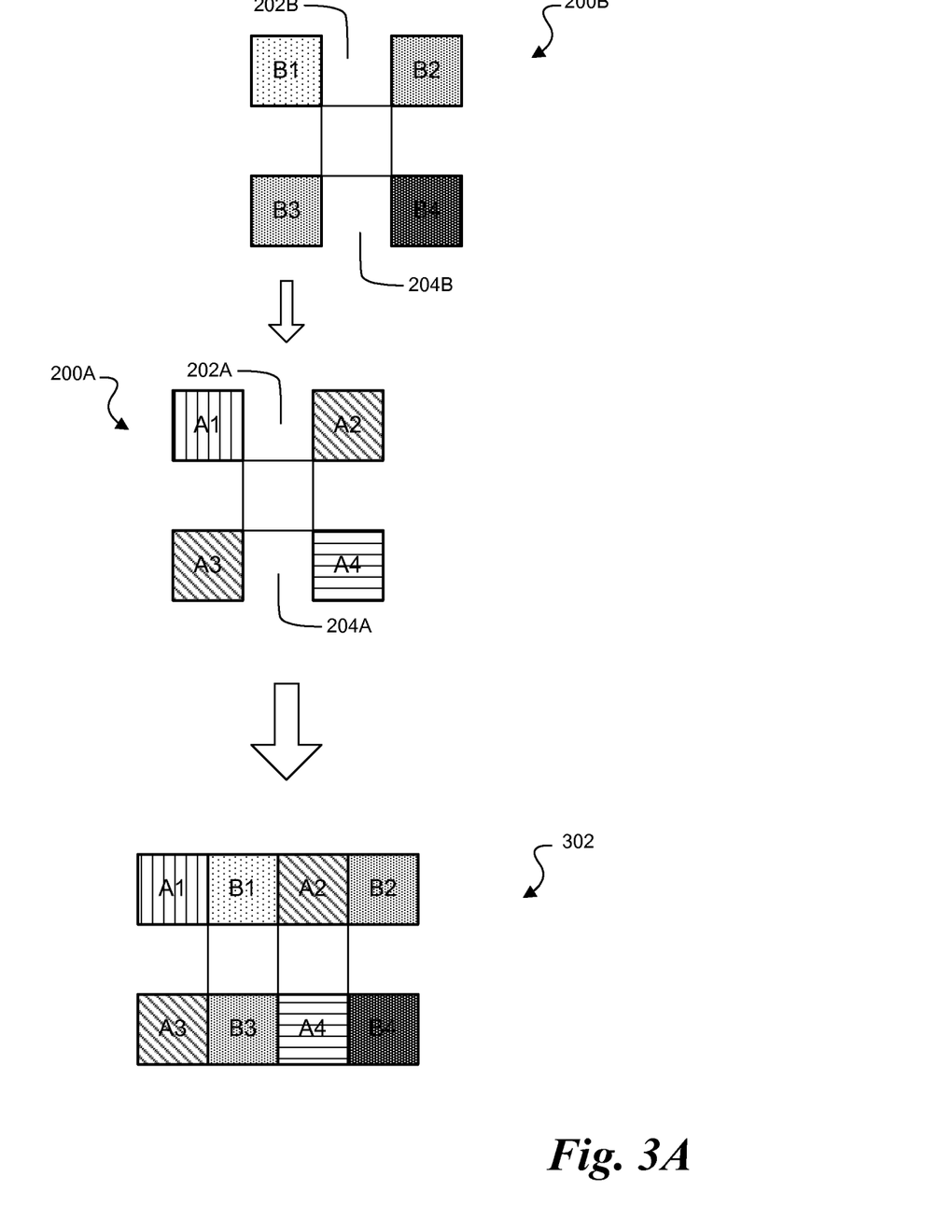
FIGS. 3A-3D are plan views illustrating an embodiment of a sequence for meshing filter sets together into a minimal repeating unit.

FIG. 3A illustrates an initial part of the sequence in which filter set 200B is meshed with filter set 200A. The two filter sets mesh together such that individual filter B3 fits into interstitial space 204A and individual filter B1 fits into interspace interstitial space 202A. Similarly, individual filter A2 fits into interstitial space 202B and individual filter A4 fits into interstitial space 204B. The result of meshing filter sets 200B and 200A is meshed filter arrangement 302.

Figure 3B:
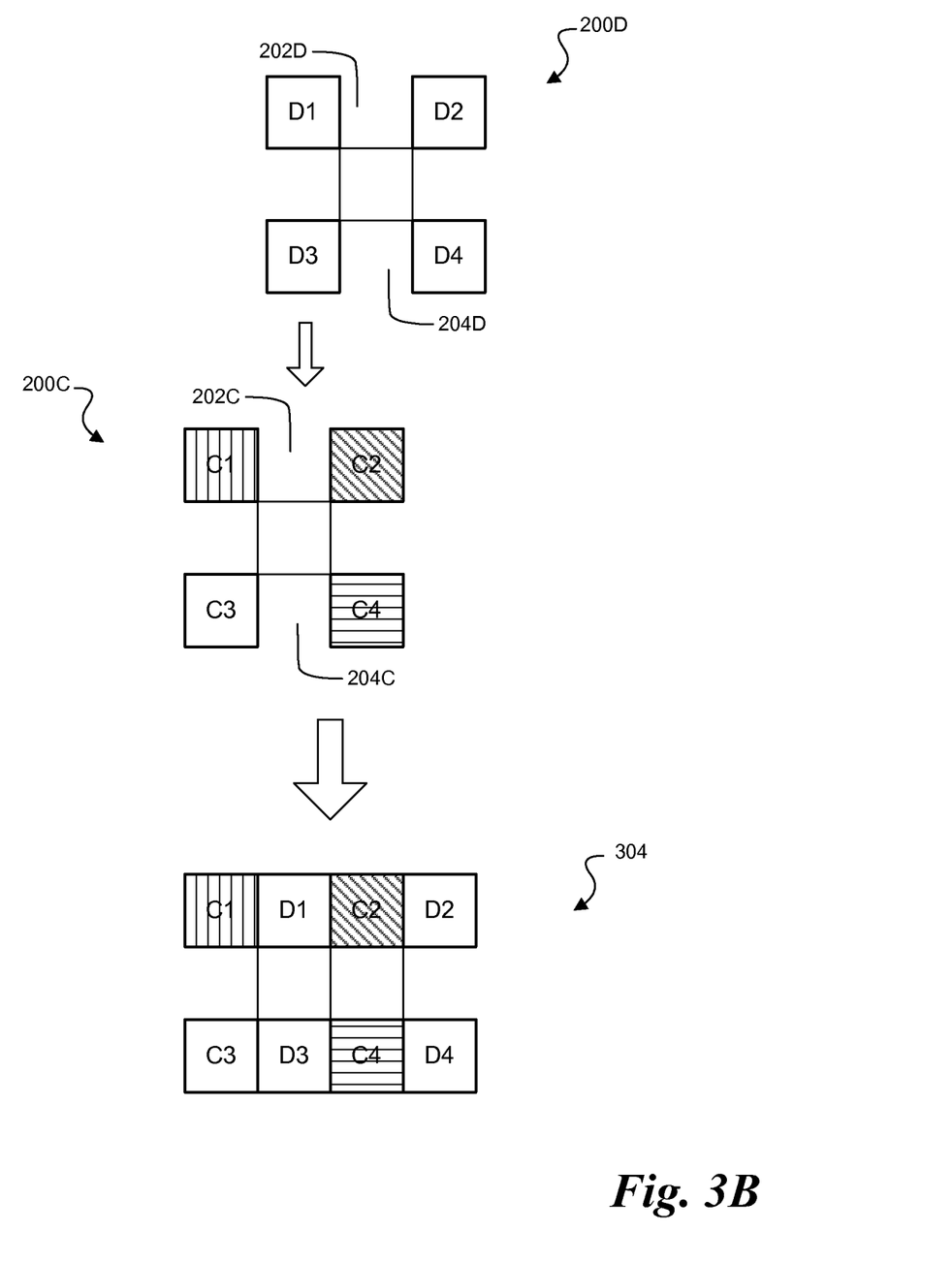

FIG. 3B illustrates a next step in the sequence in which filter set 200D is meshed with filter set 200C. The filter sets are meshed together such that individual filter D1 fits into interstitial space 202C and individual filter D3 seats fits into interstitial space 204C. Similarly, individual filter C2 fits into interstitial space 202D and individual filter C4 fits into interstitial space 204D. The result of meshing filter sets 200D and 200C is meshed filter arrangement 304.

Figure 3C:
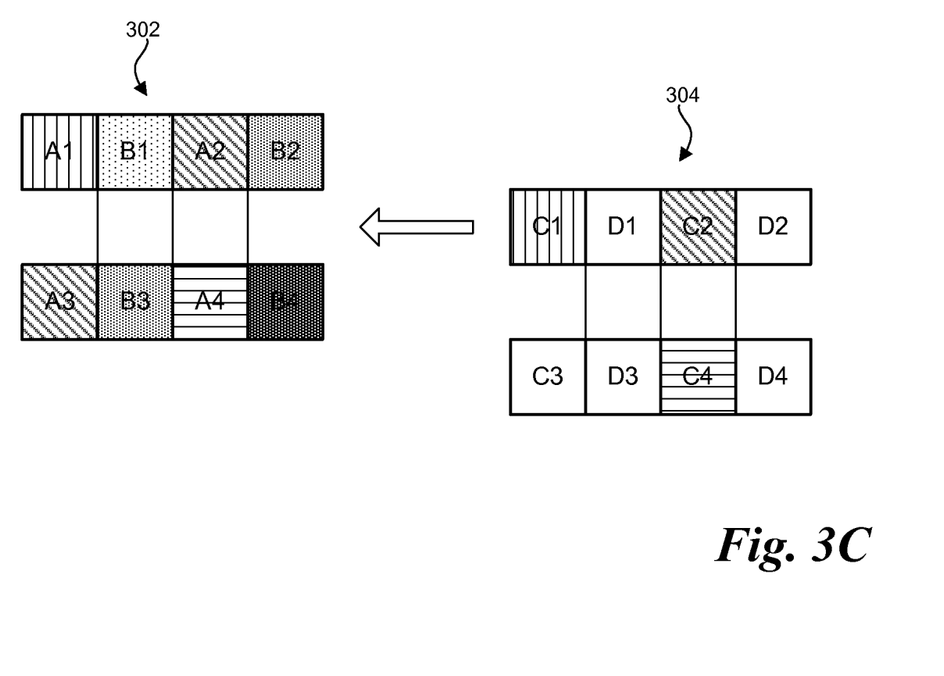

FIG. 3C illustrates the final step in the sequence in which filter arrangement 302 is meshed with filter arrangement 304 to form a meshed minimal repeating unit. Filter arrangement 304 is meshed with filter arrangement 302 such that the top row of filter arrangement 304 (C1/D1/C2/D2) fits in the empty middle row of filter arrangement 302. Similarly the bottom row of filter arrangement 302 (A3/B3/A4/B4) fits in the empty middle row of filter arrangement 304.

Figure 3D:
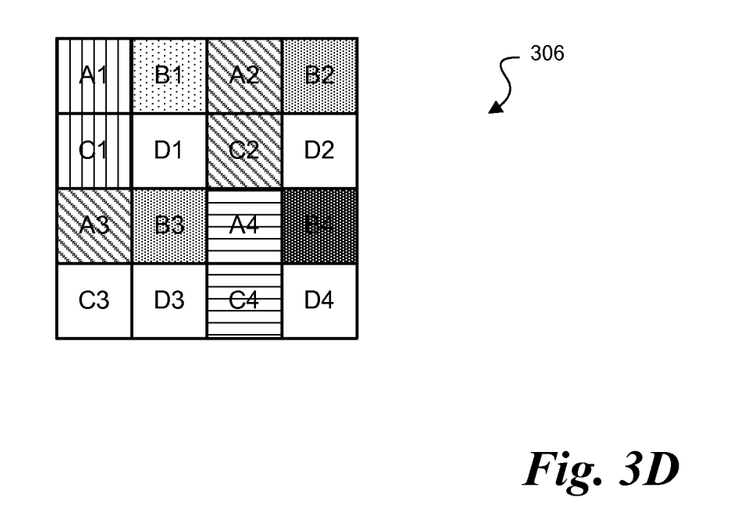

FIG. 3D illustrates the minimal repeating unit (MRU) 306 resulting from meshing filter arrangement 302 and 304 in FIG. 3C. MRU 306 is a 4×4 array of filters made up of filter sets 200A-200D, each filter set having four individual filters. As a result, MRU 306 includes 16 individual filters. More generally, if N filter sets each having M individual filters are meshed together, the result will be an MRU including N×M individual filters. In other embodiments, a different number of filter sets and/or filter sets with different numbers of individual filters can be used so that the size and composition of the MRU can be varied; for example MRUs with 4, 9, 16, or some other number of individual filters are possible. In still other embodiments, every filter set need not have the same number of individual filters.

Figure 4:
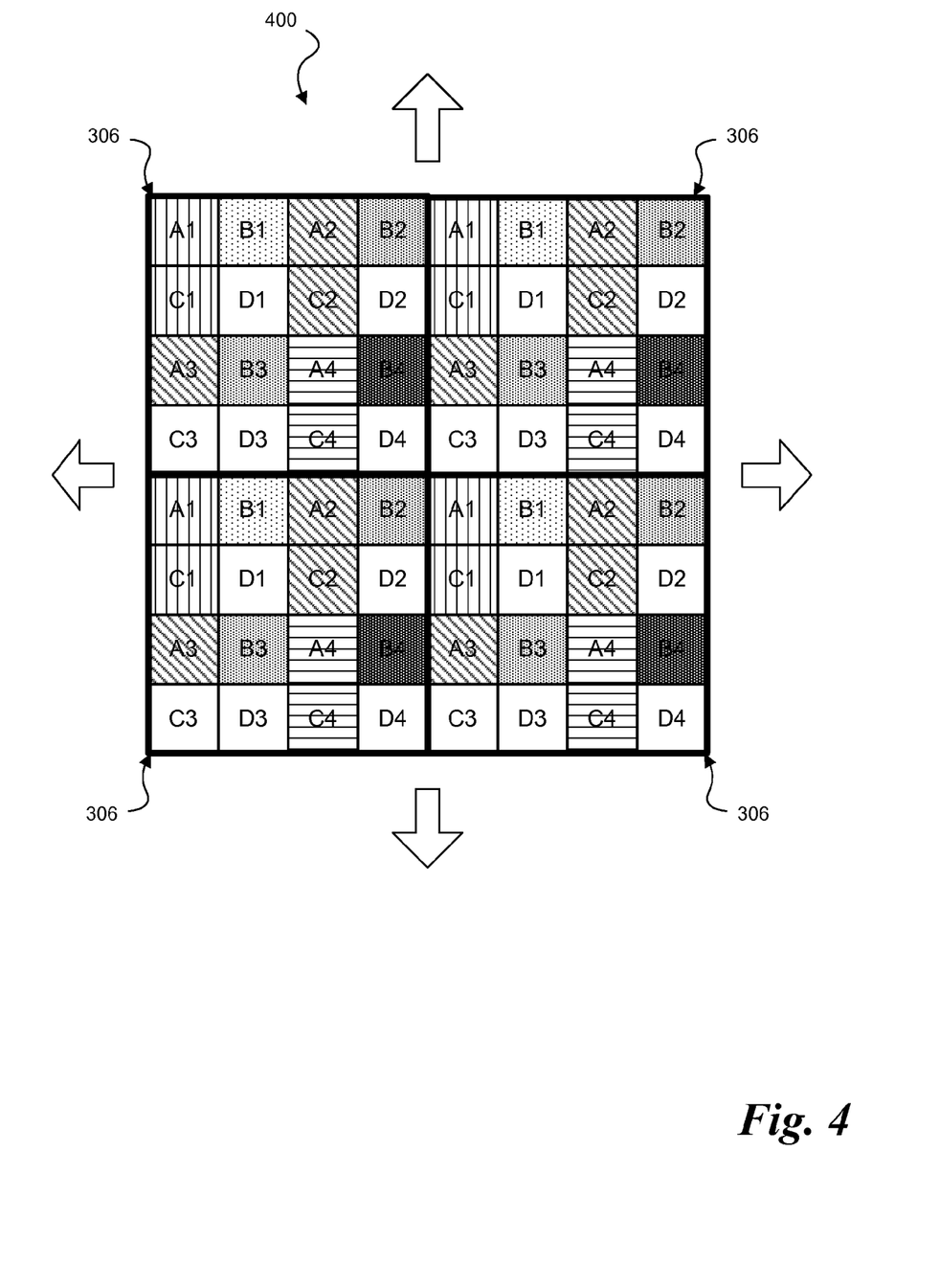
FIG. 4 is a plan view of an embodiment of a color filter array including a plurality of tiled minimal repeating units such as the one shown in FIG. 3D.

FIG. 4 illustrates an embodiment of a color filter array (CFA) 400. Filter array 400 includes multiple MRU's 306 tiled together to form the color filter array. MRUs 306 are indicated in the drawing by a heavy outline. Each MRU is tiled into the filter array so that it abuts at least one other MRU along one of its edges. Only four MRUs 306 are shown in the figure, but of course any practical color filter array would use many more MRU's than shown, as indicated in the figure by the arrows. Color filter arrays are used in conjunction with pixel arrays in an image sensor; in most cases, a color filter array will include as many individual filters as there are pixels in the pixel array with which it will be coupled.

Figure 5:
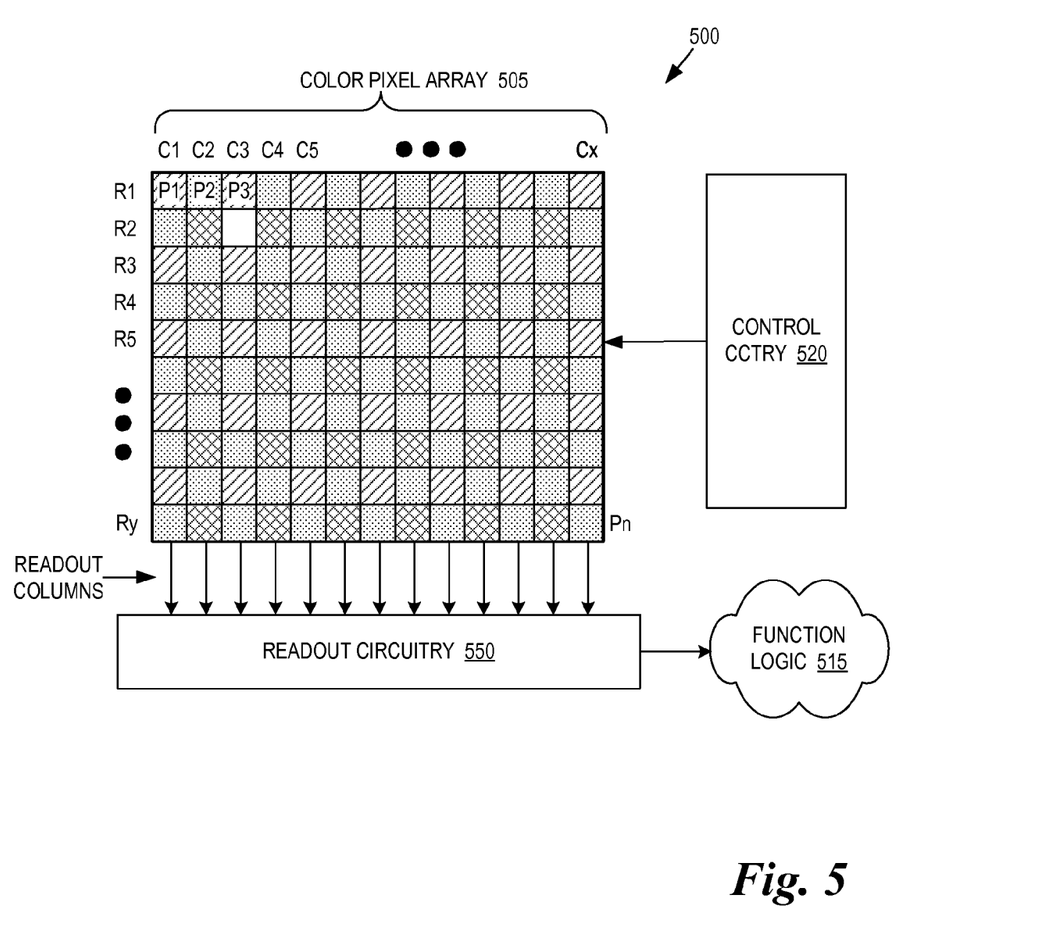
FIG. 5 is a schematic drawing of an embodiment of an image sensor including a color filter array such as the one shown in FIG. 4.

FIG. 5 illustrates an embodiment of a CMOS image sensor 500 including a color pixel array 505, readout circuitry 550, function logic 515 coupled to the readout circuitry, and control circuitry 520 coupled to the pixel array. Color pixel array 505 is a two-dimensional ("2D") array of imaging sensors or pixels (e.g., pixels P1, P2 . . . , Pn) having X pixel columns and Y pixel rows and can be implemented as either a frontside-illuminated pixel array or a backside-illuminated image pixel array. In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object. Color pixel array 505 assigns color to each pixel through the use of a color filter array ("CFA") coupled to the pixel array. CFAs assign a separate primary color to each pixel by placing a filter of that color over the pixel; thus, for example it is common to refer to a pixel as a "blue pixel" if it is coupled to a blue filter, a "green pixel" if it is coupled to a green filter, or a "red pixel" if it is coupled to a red filter. As photons pass through a filter of a certain primary color to reach the pixel, only wavelengths of that primary color will pass through. All other wavelengths will be absorbed.

After each pixel in pixel array 505 has acquired its image data or image charge, the image data is read out by readout circuitry 550 and transferred to function logic 515 for storage, additional processing, etc. Readout circuitry 550 may include amplification circuitry, analog-to-digital ("ADC") conversion circuitry, or otherwise. Function logic 515 may simply store the image data or even manipulate the image data by applying post-image effects (e.g., crop, rotate, remove red eye, adjust brightness, adjust contrast, or otherwise).

Control circuitry 520 is coupled to pixel array 505 to control operational characteristic of color pixel array 505. For example, control circuitry 520 may generate a shutter signal for controlling image acquisition.

The pixels in the pixel array, and/or circuitry in the reading circuitry 550, can be designed or adjusted so that pixels in the pixel array are grouped into circuit blocks, each circuit block including pixels associated with one of the filter sets 200A-200D in the color filter array. With the pixels group this way pixels corresponding only to particular filter sets within the color filter array can be individually readable; in other words, pixels corresponding to one filter set can be read without necessarily reading pixels corresponding to another filter set. The pixels corresponding to a selected filter set can be read throughout the pixel array, or different pixel sets can be read in different parts of the color filter array, for example depending on the characteristics of the captured image.

Figure 6A:
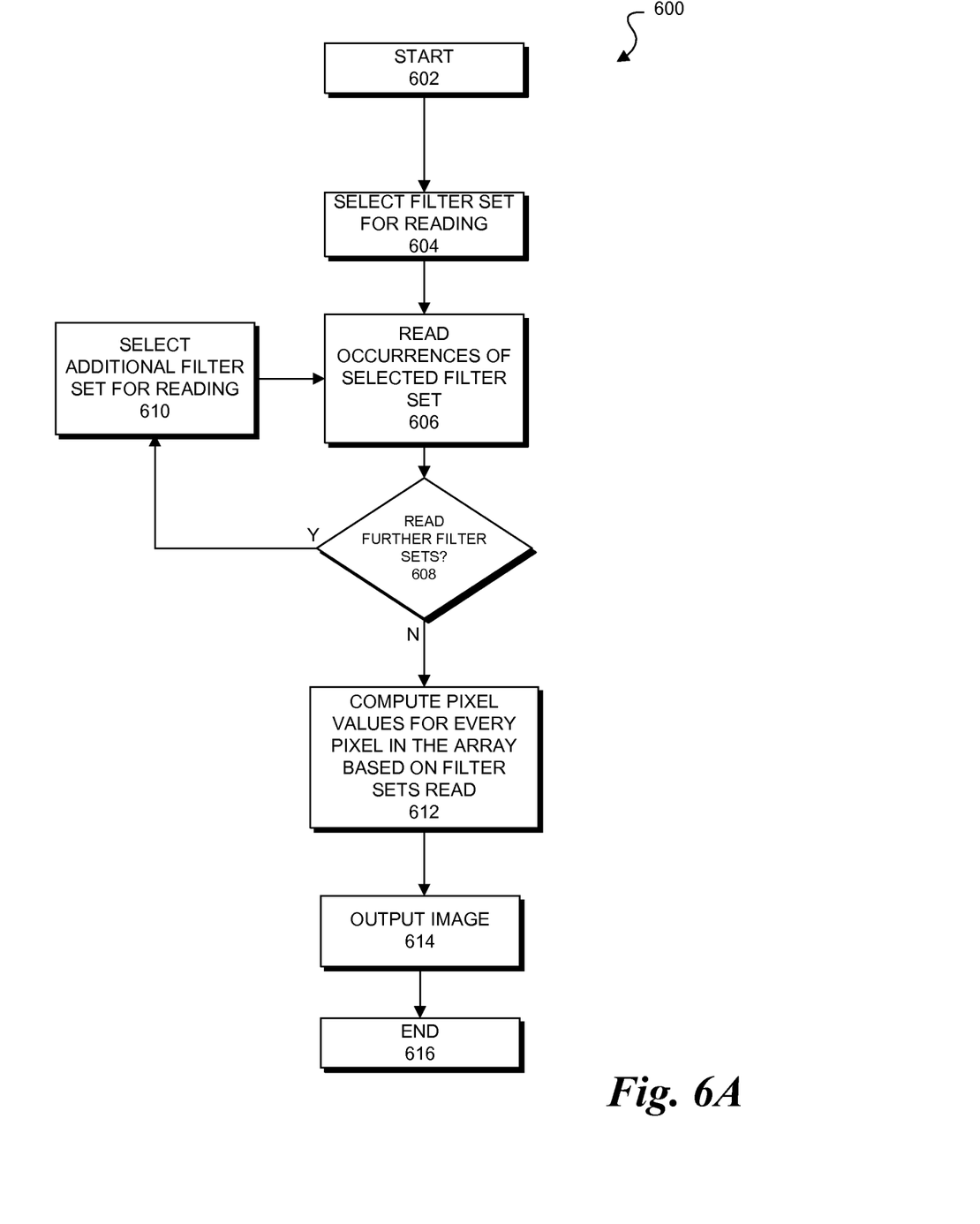
FIG. 6A is a flowchart of an embodiment of a process for reading pixels from an image sensor that uses a color filter array such as the one shown in FIG. 4.
Figure 6B:
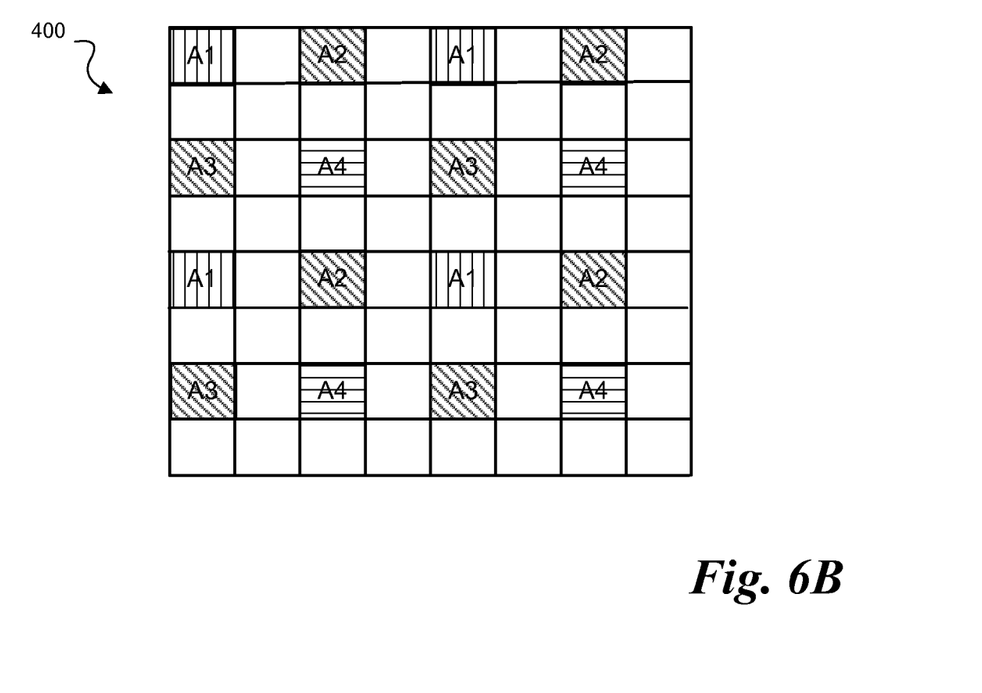
FIGS. 6B-6E are plan views of an embodiment of an image sensor using a color filter array illustrating reading different filter sets from the color filter array.
Figure 6C:
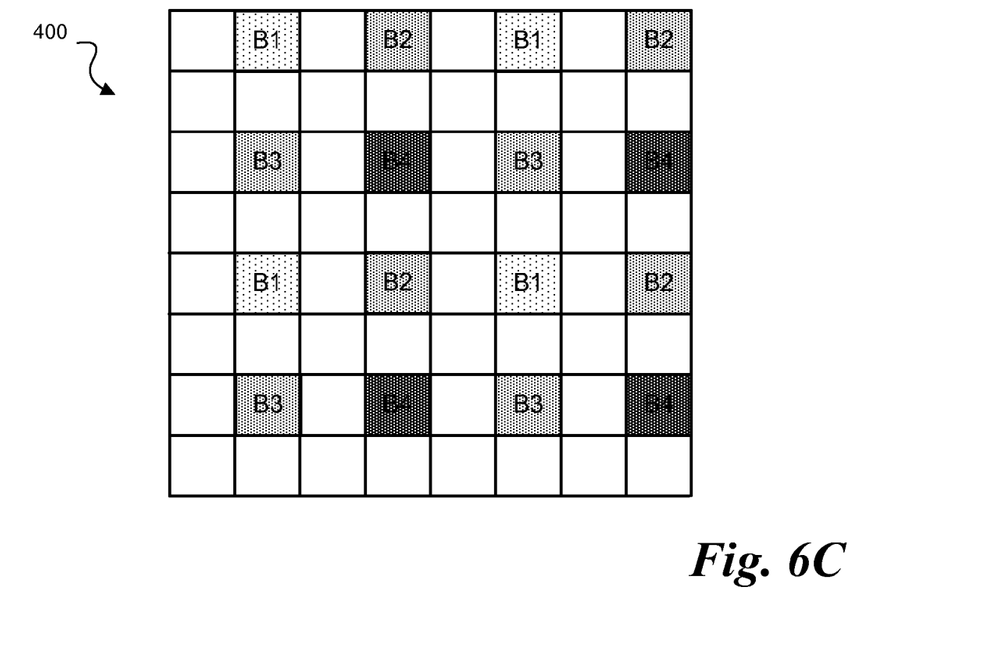
Figure 6D:
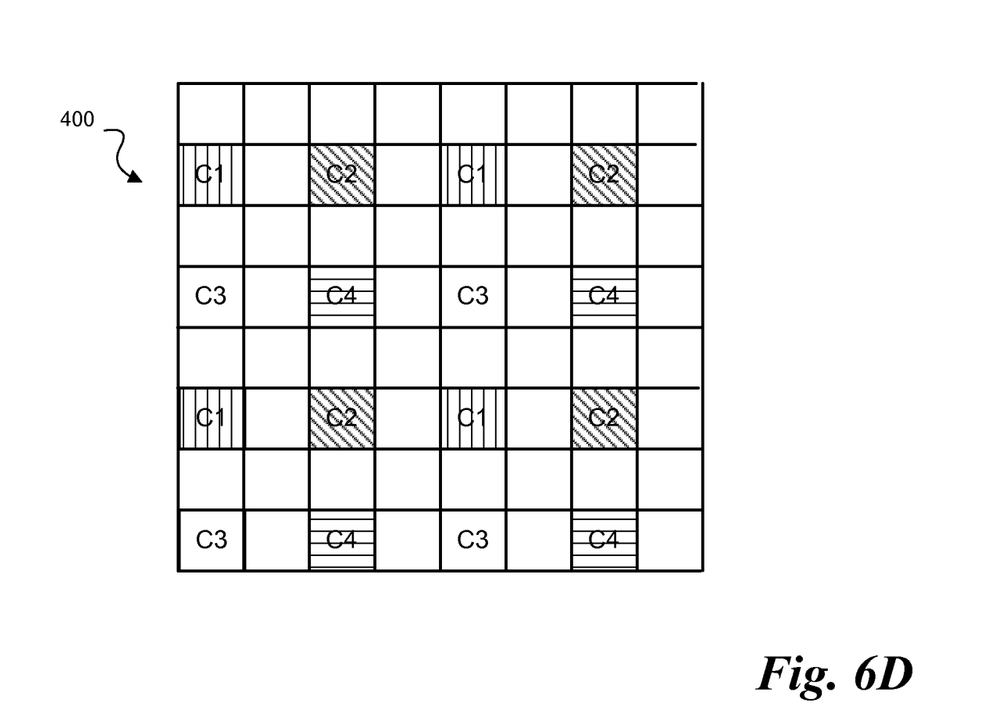
Figure 6E:
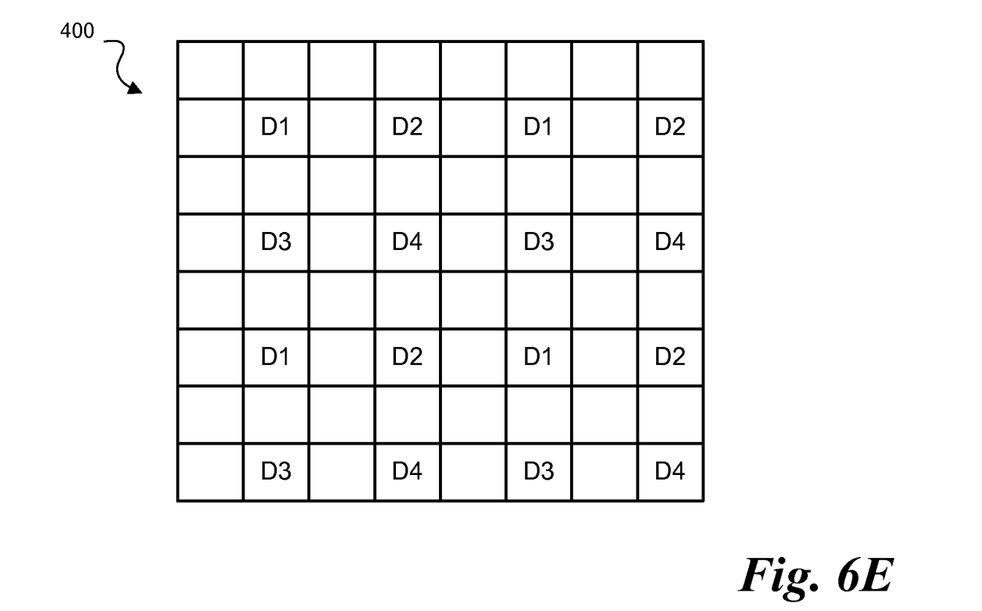

FIGS. 6A-6E illustrate an embodiment of a process for reading pixels from a pixel array such as pixel array 400. FIG. 6A is a flowchart of the process, which is explained with reference to FIGS. 6B-6E. The process starts at block 602. At block 604 a filter set from the color filter array is selected to be read, meaning that the pixels in the pixel array that correspond to filters in the selected filter set will be read. In an embodiment of an image sensor using filter array 400, for example, one may want to read pixels corresponding to filter set 200A over the whole array as shown in FIG. 6B, but in other embodiments, one may want to read pixels corresponding to one or more of the other filter sets, as shown in FIGS. 6C-6E. The choice of filter set to be read will generally depend on the application for which the image sensors being used.

At block 606 the filter set selected at block 604 is read from the pixel array. If the selected filter set is filter set 200A, then the pixels read are shown in FIG. 6B. Similarly, if the selected filter set is one of the other filter sets 200B-200D, then pixels corresponding to the other filter sets are read, as shown in FIGS. 6C-6E. In the embodiments illustrated in FIG. 6B-6E, the selected filter set is read out over the entire color filter array, but in other embodiments the selected filter set can be read out only over part of the array depending, for example, on the characteristics of the image captured by the image sensor.

At block 606, process checks to see if any additional filter sets are to be read from the image sensor. In the illustrated embodiment, the process checks if additional filter sets are to be read after the selection and reading of the first filter set, but in other embodiments one or more filter sets to be read can be specified simultaneously at another time. For example, in one embodiment all the filter sets to be read can be selected at block 604.

In some embodiments it can be desirable to read more than one filter set from the color filter array. The data from pixels corresponding to one or more additional filter sets that are read can be used to supplement pixel data from pixels corresponding to previously-selected filter sets, to help in interpolating data from other filter sets pixels that were not associated with any selected filter set, and other such functions. For example, in dim light pixels corresponding to both the RGB filter set 200A and the RGBC filter set 200C can be read. The RGB pixel data from filter set 200C can be used to supplement the RGB pixel data from filter set 200A, while the clear (C) pixel from filter set 200C can provide additional luminance information that can result in a sharper image than might otherwise be possible using only RGB filter set 200A in dim light conditions. In another example, and pixel data from a CYYM filter set such as filter set 200B can be used to help complete an image captured using an RGB filter set such as filter set 200A.

If at block 608 there is more filter sets to be read, the process goes to block 610, where the additional filter set is selected, and then returns to block 606 to read the additional filter set. If there is no additional filter sets to be read at block 608, the process continues to block 612.

At block 612 pixel values are determined for every pixel in the pixel array. In one embodiment, the pixel data or pixel value—that is, the signal resulting from exposure of the pixel to light—for the pixels corresponding to the selected filter sets is used for those pixels, while the data for pixels corresponding to non-selected filter sets is determined based on interpolation. In other embodiments, pixel values can be determined by other processes such as substitution.

At block 614 the image—that is, pixel data or pixel values for every pixel in the pixel array—are output, for example to a memory, a storage device, or to a processor and associated function logic for further image processing. At block 616 the process ends.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
a pixel array including a plurality of pixels; and
a filter array positioned over the pixel array, the filter array comprising a plurality of tiled minimal repeating units, each minimal repeating unit including at least four meshed filter sets, wherein each meshed filter set includes a different set of two or more filter wavelengths than any other meshed filter set in the minimal repeating unit such that no two meshed filter sets in the minimal repeating unit share the same set of filter wavelengths, and wherein when placed in the filter array each filter set includes interstitial spaces between its filters to accommodate filters from another filter set.

2. The apparatus of claim 1 wherein when placed in the filter array the filters in each filter set do not abut each other.

3. The apparatus of claim 1 wherein each filter set includes four filters.

4. The apparatus of claim 3 wherein one filter set of the at least four filter sets includes one red color filter, two green color filters, and one blue color filter.

5. The apparatus of claim 4 wherein the red, green, and blue color filters are arranged in a Bayer pattern.

6. The apparatus of claim 3 wherein one filter set of the at least four filter sets includes cyan, magenta, and yellow filters.

7. The apparatus of claim 1 wherein one filter set of the at least four filter sets includes red, green, blue and clear filters.

8. The apparatus of claim 1 wherein one filter set of the at least four filter sets includes only clear filters.

9. The apparatus of claim 1 wherein the minimal repeating unit includes sixteen filters.

10. The apparatus of claim 1 wherein the pixels that correspond to the filters in one filter set can be selectively read out separately from the pixels that correspond to the filters in a different filter set.

11. An image sensor comprising:
a pixel array including a plurality of pixels;
a filter array positioned over the pixel array, the filter array comprising a plurality of tiled minimal repeating units, each minimal repeating unit including at least four meshed filter sets, wherein each meshed filter set includes a different set of two or more filter wavelengths than any other meshed filter set in the minimal repeating unit such that no two meshed filter sets in the minimal repeating unit share the same set of filter wavelengths, and wherein when placed in the filter array each filter set includes interstitial spaces between its filters to accommodate filters from another filter set;
readout circuitry coupled to the pixel array; and
function logic coupled to the readout circuitry.

12. The image sensor of claim 11 wherein each filter set includes four filters.

13. The image sensor of claim 12 wherein one filter set of the at least four filter sets includes one red color filter, two green color filters, and one blue color filter.

14. The image sensor of claim 12 wherein one filter set of the at least four filter sets includes cyan, magenta, and yellow filters.

15. The image sensor of claim 12 wherein one filter set of the at least four filter sets includes red, green, blue and clear filters.

16. The image sensor of claim 12 wherein one filter set of the at least four filter sets includes only clear filters.

17. The image sensor of claim 11 wherein the minimal repeating unit includes sixteen filters.

18. The apparatus of claim 11 wherein the readout circuitry includes circuit blocks by which pixels that correspond to the color filters in one filter set can be selectively read out separately from the pixels that correspond to the color filters in a different filter set.

19. A process for reading data from pixels in a pixel array, the process comprising:

selecting one of at least four meshed filter sets included in a minimal repeating unit, wherein each meshed filter set includes a different set of two or more filter wavelengths than any other meshed filter set in the minimal repeating unit such that no two meshed filter sets in the minimal repeating unit share the same set of filter wavelengths, wherein when placed in the filter array each filter set includes interstitial spaces between its filters to accommodate filters from another filter set, and wherein a plurality of the minimal repeating units are tiled to form a filter array coupled to the pixel array;

reading pixels corresponding to the selected filter set;

determining pixel data for pixels corresponding to non-selected filter sets; and outputting pixel data for the entire pixel array.

20. The process of claim 19 wherein each filter set includes four filters.

21. The process of claim 20 wherein one filter set of the at least four filter sets includes one red color filter, two green color filters, and one blue color filter.

22. The process of claim 20 wherein one filter set of the at least four filter sets includes cyan, magenta, and yellow filters.

23. The process of claim 20 wherein one filter set of the at least four filter sets includes red, green, blue and clear filters.

24. The process of claim 20 wherein one filter set of the at least four filter sets includes only clear filters.

25. The process of claim 19 wherein reading pixels corresponding to the selected filter set comprises reading out pixels corresponding to every occurrence of the selected filter set in the filter array.

26. The process of claim 19, further comprising:

selecting one or more additional filter sets included in the minimal repeating unit;

reading the pixels in the pixel array that correspond to the one or more additional filter sets.

27. The process of claim 26, further comprising determining pixel data for pixels corresponding to non-selected filter sets.

* * * * *